United States Patent [19]

Simpkins et al.

[11] Patent Number: 4,463,257
[45] Date of Patent: Jul. 31, 1984

[54] ROTATABLE SUPPORT FOR SELECTIVELY ALIGNING A WINDOW WITH THE CHANNEL OF A PROBE

[75] Inventors: Gideon M. Simpkins, Scotts Valley; William E. Drummond, Mountain View, both of Calif.

[73] Assignee: Tracor Xray Inc., Mountain View, Calif.

[21] Appl. No.: 405,531

[22] Filed: Aug. 5, 1982

[51] Int. Cl.³ ............................................. G01N 23/00
[52] U.S. Cl. .................................. 250/310; 250/505.1; 378/161
[58] Field of Search ...................... 250/310, 505, 491.1; 378/161; 73/660, 661

[56] References Cited

U.S. PATENT DOCUMENTS

| | | | |
|---|---|---|---|
| 3,319,064 | 5/1967 | Guernet et al. | 378/161 |
| 3,864,570 | 2/1975 | Zingaro | 250/310 |
| 4,107,562 | 8/1978 | Koller et al. | 378/161 |

Primary Examiner—Bruce C. Anderson
Attorney, Agent, or Firm—Limbach, Limbach & Sutton

[57] ABSTRACT

A mechanism is disclosed for selectively aligning one of two different radiation passing windows with the channel of a measuring device. The measuring device includes an elongated tubular probe having a channel formed therein. A spherical cap, having a diameter less than the diameter of the probe, is mounted to the end of the probe, and is rotatable between a first and second position. A pair of windows are mounted in the cap in a manner such that when the cap is oriented in the first position, the first window is aligned with the channel, and when the cap is oriented in the second position, the second window is oriented with the channel. In the preferred embodiment, an outer tubular member is mounted around the probe and includes axially projecting teeth which engage with a spur gear connected to the rotatable cap. The rotation of the outer tubular member relative to the probe drives the spur gear for rotating the cap.

30 Claims, 8 Drawing Figures

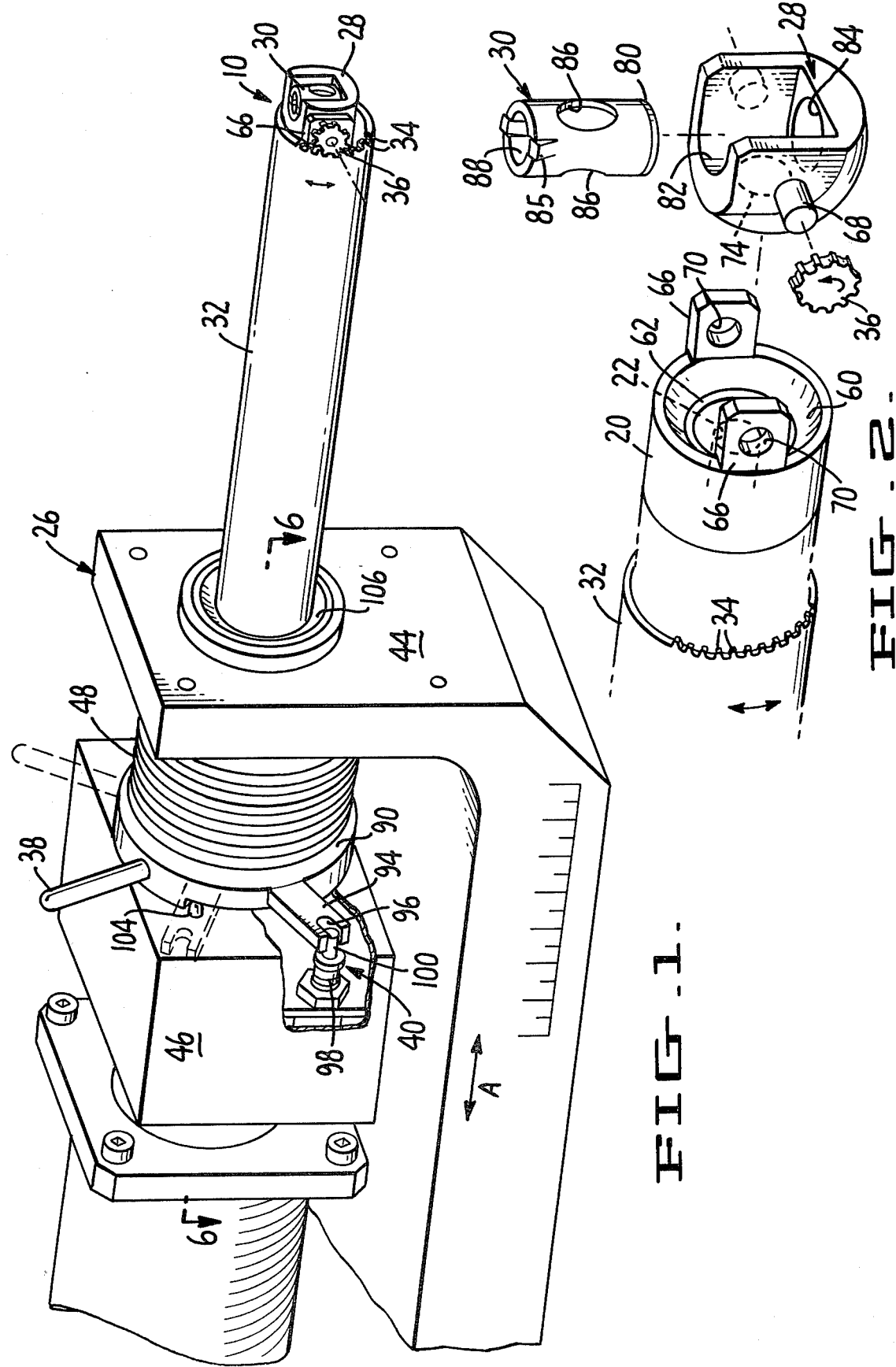

ROTATABLE SUPPORT FOR SELECTIVELY ALIGNING A WINDOW WITH THE CHANNEL OF A PROBE

The subject invention relates to a new and improved mechanism for selectively aligning a radiation passing window with a detecting device. The subject mechanism is designed to operate in low pressure conditions and is compact in construction to facilitate improved detection capability.

BACKGROUND OF THE INVENTION

In the prior art, many techniques have been developed for determining the composition of a sample. One of the more common techniques is spectroscopy wherein electromagnetic energy emitted from a sample is measured and evaluated to determine the elements contained in the sample. While there are many types of spectroscopic measurement methods, the subject invention is particularly adapted for use with X-ray detectors. In the latter technique, a detector is provided which senses X-rays emanating from a sample.

Using an X-ray fluorescent analyzer, a spectrum associated with the sample can be generated. By analyzing the spectral data, the composition of the sample can be determined.

X-ray detection equipment is typically designed to operate in conjunction with electron microscopes, such as scanning electron microscopes or transmission electron microscopes. The specimen chamber in these electron microscopes must be operated in a vacuum. This requirement imposes rather stringent design criteria on X-ray detection devices since they must be compatible with a vacuum environment.

In the prior art, a number of X-ray detection devices have been developed for use with electron microscopes. The devices are generally provided with an elongated tubular member or probe, which is typically connected to some form of frame for housing the hardware of the device. The opposed free end of the tubular member is received in the specimen chamber of the electron microscope, and is sealed with a radiation passing window. The interior of the tubular member contains a channel for receiving the X-ray radiation entering the probe through the window. An X-ray sensor, such as a lithium-drifted silicon device, is mounted in the channel of the probe, behind the window. Since the sensor requires a vacuum to operate, the channel of the probe must be sealed and evacuated.

As mentioned above, the free end of the probe is provided with some form of window to permit the X-ray radiation to enter the channel and reach the sensor. More particularly, a relatively thin window, formed for example, from aluminum foil, is provided to permit a high percentage of X-rays, emanating from the sample, to enter the channel. Unfortunately, a thin aluminum window, while effective for passing a large amount of radiation, is structually weak. This weakness would pose no difficulties if the window were never subjected to the strains of air pressure. However, in normal procedures, each time a new sample is introduced into the electron microscope, the specimen chamber must be exposed to full air pressure conditions. Since a vacuum is present in the channel of the probe, the thin film window is subjected to an extreme pressure differential when the microscope chamber is exposed to atmospheric pressure. This pressure differential will result in the rupture of the thin film window. If the thin film window is ruptured, the shock of the abrupt pressure change in the probe can damage the sensor.

Accordingly, a means must be provided to prevent the rupture of the thin film window. This object is achieved in some prior art detectors by providing a second, thicker and stronger window, which will resist collapse when subjected to normal air pressure. The thicker window may be in the form of a beryllium foil, which will transmit a portion of the X-ray spectrum, particularly at higher energy levels. Since the beryllium window will pass some radiation, it can be used in many measurement situations. However, many test techniques require that lower level energy radiation be detected, such that a beryllium window alone is insufficient.

In the prior art devices which rely on a two-window construction, a means must be provided for selectively aligning one of the two windows with the channel of the probe. In operation, the thicker beryllium window is initially aligned with the channel of the probe. After the sample has been placed in the electron microscope and the specimen chamber is evacuated, a mechanism must operate to move the thin aluminum film window into alignment with the channel. When the testing is complete, the beryllium window is moved back into alignment with the channel, prior to the pressurization of the chamber, thereby preventing the rupture of the thin film window.

The mechanisms used in the prior art were capable of moving the thin film window into and out of alignment with the channel. However, the latter mechanisms tended to be relatively cumbersome, which inhibited optimum measurement capability. For example, one known device included the use of a large outer tube having both windows mounted thereon. The outer tube was disposed around the probe and mounted for rotational movement along an axis offset from the axis of the probe. By rotating the outer tube, the windows could be brought into selective alignment with the channel.

Unfortunately, the use of the large outer tube added significantly to the total diameter of the probe. This extra size created some difficulties. More particularly, many electron microscopes could not accommodate a probe having a large diameter. In addition, because of the geometry of the specimen chamber, it was difficult to move a large diameter probe into close proximity with the sample. Since radiation levels fall off as function of the distance squared, it is highly desirable to be able to position the probe as close to the sample as possible.

Some devices found in the prior art are provided with only a single, thin window. In the latter devices, the thin film window is protected by a gate valve. In use, when the specimen chamber is evacuated, the gate in the valve is retracted, exposing the window to permit radiation to pass into the probe towards the sensor. Thus, a functional window support can be manufactured which does not include a second, thicker window. However, a second, thicker window provides enhanced versatility by permitting sensing in some measurement situations.

Accordingly, it is an object of the subject invention to provide a new and improved mechanism for selectively aligning at least one radiation passing window with the channel of a detector, that overcomes the shortcomings of the prior art devices.

It is another object of the subject invention to provide a new and improved mechanism which is relatively compact in configuration, permitting the tubular probe to be moved relatively close to the sample for enhanced sensitivity.

It is a further object of the subject invention to provide a new and improved mechanism, for selectively aligning one of two different windows with the channel, which is operable from a point spaced from the end of the probe.

It is still another object of the subject invention to provide a new and improved mechamism for selectively aligning one of two different windows with the channel of a probe wherein at least one of said windows is readily replaceable.

It is still a further object of the subject invention to provide a new and improved mechanism for selectively aligning one of two different windows with the channel of a probe which includes an interlock means to prevent the relatively fragile thin film window from being moved into alignment with the channel until a vacuum has been established in the specimen chamber of the microscope.

SUMMARY OF THE INVENTION

In accordance with these and many other objects, the subject invention provides for a mechanism capable of selectively aligning at least one radiation passing window with a channel of a detection device. The detection device includes a tubular probe, mounted to a frame, and having an elongated channel formed therein. An X-ray sensor is mounted within the channel. The free end of the probe can be introduced into the specimen chamber of an electron microscope whereby radiation emitted from a sample will enter the channel of the probe to reach the sensor mounted therein.

In accordance with the subject invention, a cap is rotatably mounted at the free end of the tubular probe. The axis of rotation of the cap is perpendicular to the longitudinal axis of the probe. The cap is rotatable between a first and second position. The adjacent surfaces of the cap and the probe are provided with complementary spherical configurations. A means is provided to effect a seal between these adjacent surfaces. A first window is mounted on the cap and is located such that it will be aligned with the channel when the cap is oriented in the first position. Preferably, a second window is mounted in the cap in a manner to be aligned with the channel when the cap is oriented in the second position.

In the preferred embodiment, a means is provided for rotating the cap. The rotation means includes a spur gear mounted to the cap. An outer tubular member is rotationally mounted around the inner tubular probe. The end of the outer tubular member adjacent the cap is provided with axially projecting teeth engageable with the spur gear. The rotation of the outer tube drives the spur gear, causing the rotation of the cap.

A lever means may be connected to the outer tubular member at a point spaced from the cap to facilitate the rotational movement. In the preferred embodiment, a locking mechanism is provided to prevent the inadvertent alignment of the thin film window with the channel, unless the specimen chamber is evacuated, thereby reducing the likelihood of damage to the window. The preferred embodiment also includes a construction permitting the ready replacement of the thin film window.

Further objects and advantages of the subject invention will become apparent from the following detailed description taken in conjunction with the drawings in which:

BRIEF DESCRIPTION OF THE DRAWINGS

FIG. 1 is a perspective view of a detection device incorporating the new and improved window holder mechanism of the subject invention.

FIG. 2 is an enlarged, exploded perspective view of the subject mechanism, which is adapted to selectively align one of two different windows with the channel of a probe.

DETAILED DESCRIPTION OF THE PREFERRED EMBODIMENT

Figure 3:
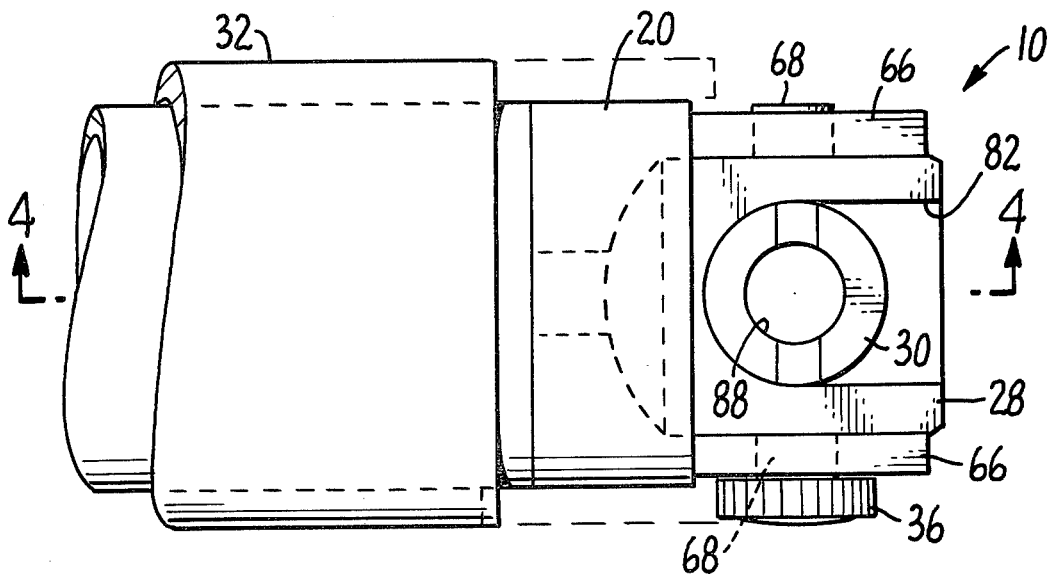
FIG. 3 is a top plan view of the new and improved mechanism of the subject invention illustrating the cap oriented in the first position.

Referring to FIGS. 1 and 2, the subject invention relates to a new and improved mechanism 10 for selectively aligning one of two different radiation passing windows with the channel of a probe of a detector. In brief, the subject invention includes an inner tubular member or probe 20 having an elongated channel 22 formed therein. Probe 20 projects through frame 26 and is connected to housing 46. The free end of probe 20 is provided with a cap 28 which is rotatably mounted thereto. Cap 28 can be provided with a removable insert 30 to facilitate the ready replacement of one of the windows. An outer tubular member 32 is mounted about probe 20 and has axially projecting teeth 34 adapted to engage with the teeth of spur gear 36. The rotation of the outer tube 32 relative to the inner tube 20 drives spur gear 36 for rotating the cap means, as described more fully hereinbelow. A lever 38 may be provided to facilitate the rotation of the outer tube. Preferably, a locking means 40 is provided to prevent the inadvertent rotation of the cap means.

Having outlined the major components of the subject invention, the new and improved mechanism 10 will be described in greater detail. More particularly, and referring in addition to FIGS. 3 to 8, the subject invention is adapted for use with a detector designed for operation with an electron microscope. The inner tubular member or probe 20 is typically inserted within the specimen chamber of an electron microscope (not shown). The front plate or flange 44 of frame 26 is bolted to the outer cover of the specimen chamber of the microscope in a manner to create an airtight seal. The depth which the probe is introduced within the chamber can be controlled by adjusting the position of control housing 46. The housing, and the elements connected thereto, are slidable in the direction illustrated by arrows A in FIG. 1. As described more fully hereinabove, an accordian-type bellows 48 is provided to permit this adjustment.

Figure 4:
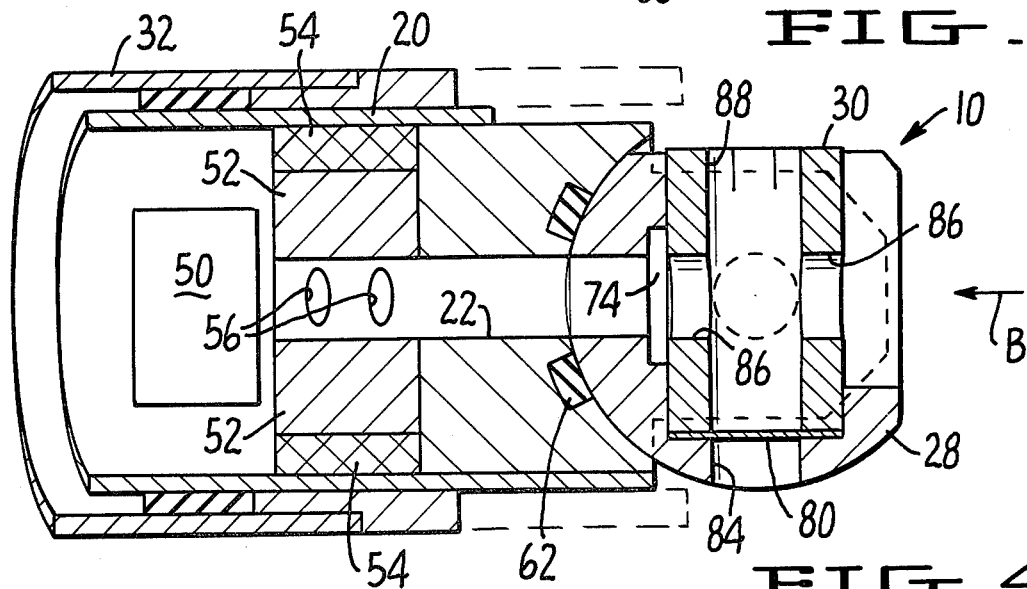
FIG. 4 is a cross sectional view, taken along the line 4—4 in FIG. 3, illustrating the cap of the subject invention oriented in the first position.
Figure 5:
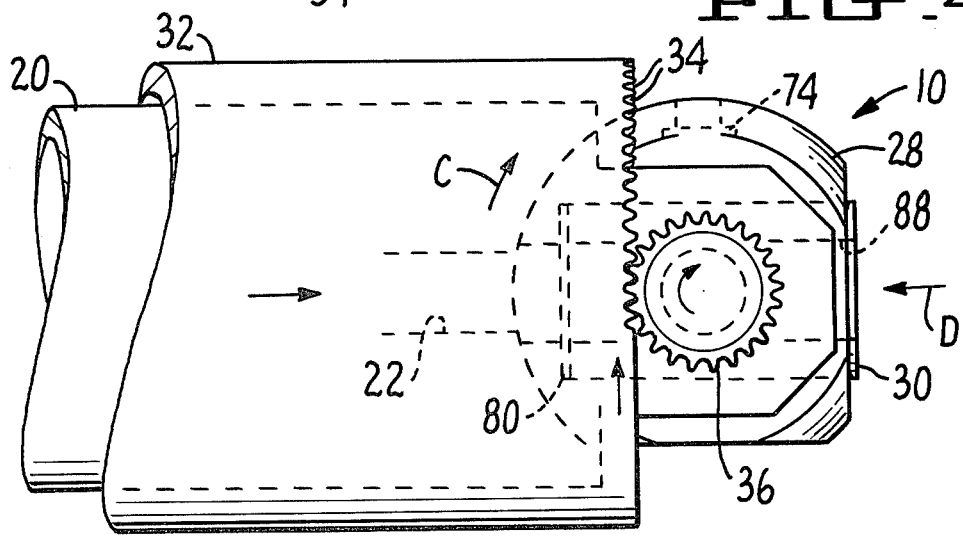
FIG. 5 is a side elevational view of the mechanism of the subject invention illustrating the cap oriented in the second position.
Figure 6:
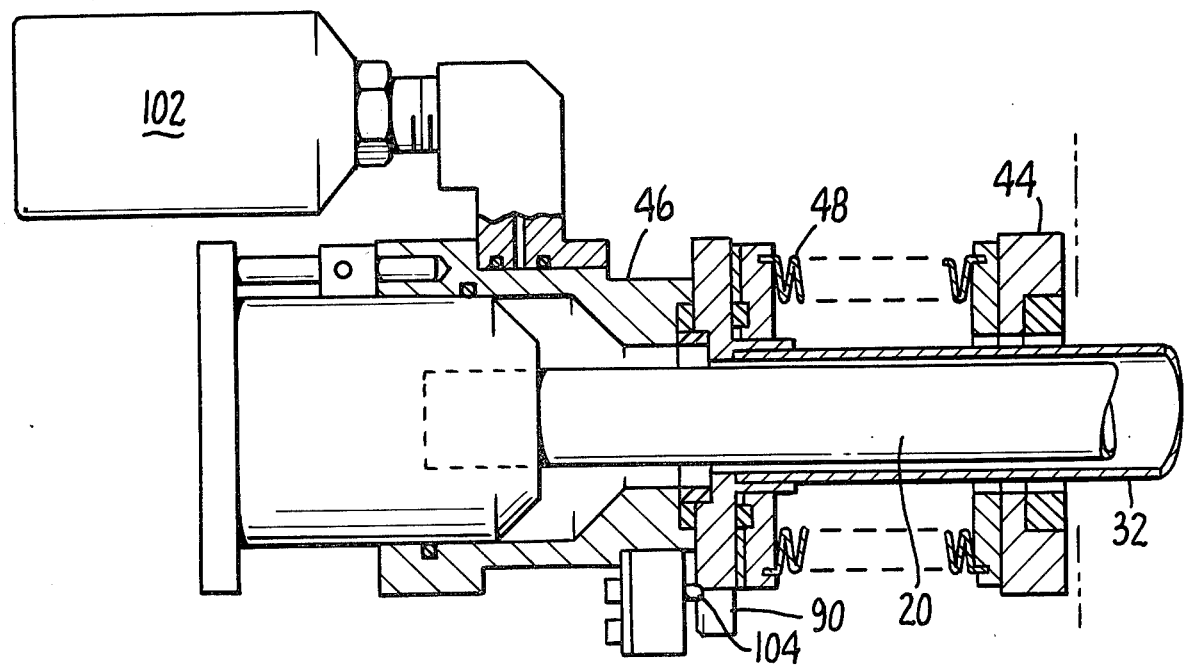
FIG. 6 is a top plan view, partially in section, of the frame of the subject invention.

Referring to FIG. 4, it will be seen that probe 20 is provided with a channel 22 that opens outwardly toward the free end of the probe. X-ray radiation, which is received through the end of the channel, is transmitted therealong to a sensor 50, illustrated schematically. The sensor is typically a lithium-drifted silicon detector.

In typical electron microscope devices, stray electrons will often enter the probe. If these electrons reach the sensor, they will interfere with the measurements. Accordingly, a pair of magnets 52 are mounted in the probe surrounding channel 22, in front of sensor 50. An iron ring 54 is mounted around the magnet to define pole positions. In operation, negatively-charged electrons are deflected by the magnets 52. The deflected electrons will pass into annular traps 56 preventing them from being detected by the sensor 50.

In order to achieve satisfactory measurement, the internal chamber of the probe is maintained in a vacuum condition. Accordingly, cap 28 is configured to maintain the desired vacuum. As illustrated in FIG. 2, cap 28 is provided with a spherical configuration, along the portions of the surface which contact the end surface 60 of probe 20. In addition, the end surface 60 of probe 20 is provided with a complementary spherical configuration, to facilitate the rotational movement between the cap 28 and the probe 20. A means for sealing the end of the probe, such as an O-ring 62, is provided.

As seen in the figures, the maximum diameter of cap 28 is less than the diameter of the cylindrical probe. By this arrangement, the probe may be used in conjunction with a specimen chamber having a relatively smaller entry port. In addition, the sensor 50 can be brought into closer proximity with the sample thereby enhancing sensitivity.

Cap 28 is rotatably mounted to the end of tube 20, between a pair of axially projecting brackets 66. A pair of pins 68 are formed on cap 28, and are receivable in aligned apertures 70 provided in bracket 66. In the illustrated embodiment, cap 28 is rotatable through a 90° arc, between a first position, shown in FIGS. 3 and 4, and a second position, shown in FIG. 5. As discussed more fully hereinbelow, radiation-passing windows located in cap 28 are disposed such that they will be selectively aligned with channel 22 in response to the rotation of the cap between the first and second positions.

While the illustrated embodiment is depicted with a two-window construction, the scope of the subject invention is intended to cover other variations. As noted above, some devices may only require a single, radiation passing window which can be selectively moved into alignment with the channel. Also, a cap construction having three windows can be provided. Alternatively, a two-window cap, which is movable between three positions is also envisioned. Three positions would permit the cap to be oriented with both windows exposed allowing the windows to be serviced while the cap remains mounted to the probe thereby maintaining the vacuum within the channel. In the latter construction, cap 28 would be movable through an arc of 110 degrees with 55 degrees separating each orientation.

As discussed above, in operation, probe 20 is mounted within the specimen chamber of an electron microscope. At the termination of each measurement cycle, when the chamber is opened to introduce a new sample, the probe is subjected to normal air pressure conditions. Accordingly, the end of the probe must be provided with a relatively rigid covering such that the vacuum generated in the channel 22 can be maintained. In the preferred embodiment of the subject invention, a relatively thick window 74 is mounted in the cap. Window 74 is preferably formed from a foil having a beryllium composition and is on the order of 8.5 to 12.7 microns thick. Since the beryllium window is relatively rigid, and not subject to rupture, it may be securely mounted in the cap. The beryllium window will pass a portion of the X-ray radiation and is therefore suitable for certain measurement applications. However, in many measurement situations, there is a need to provide a thin film window which will transmit a greater percentage of the lower energy X-rays. In the preferred embodiment of the subject invention, a thin film window 80 is provided which is replaceably mounted in the cap. Thin film window 80 may be formed from an aluminum foil having a thickness on the order of 2,000 angstroms or 0.2 microns. However, where the pump of the electron microscope is capable of generating a very good vacuum, the "thin" window can be defined simply by an aperture. As can be appreciated, the latter construction is possible if the sensor will not be exposed to any damaging or interferring conditions present in the specimen chamber.

While the subject invention is designed to reduce the likelihood of rupture of this thin film window 80, in some situations, rupture of the window is unavoidable. For example, if power is interrupted to an electron microscope, the vacuum may be inadvertently lost which could cause the rupture of the thin film window. Accordingly, the subject invention provides a means for ready replacement in the event that an unforeseen accidental rupture takes place.

In accordance with the subject invention, thin film window 80 is mounted in a generally cylindrical, hollow insert 30. Insert 30 is receivable in an arcuate recess 82 formed in the cap 28. A circular aperture 84, formed in the bottom of cap 28, is adapted to tightly receive the end of insert 30. Preferably, insert 30 is formed with a pair of wedge tabs 85, which are adapted to abut the sidewall of recess 82 for enhancing the engagement between the insert and the recess.

Insert 30 is also provided with a pair of aligned apertures 86. Apertures 86 are disposed to be aligned with beryllium window 74 when the insert is mounted within the cap 28. Accordingly, X-ray radiation entering the probe along a path illustrated by arrow B in FIG. 4 can pass through apertures 86 and beryllium window 74 into the channel to be detected by sensor 50. Of course, if the cap is only constructed with a single, thin window arrangement, there would be no need to provide apertures 86.

As discussed above, after the probe and sample are placed within the electron microscope the specimen chamber is evacuated. At this time, the pressure differential between the specimen chamber and the channel of the probe is not severe. Accordingly, the relatively more fragile thin film window 80 can be used as an interface between the probe and the specimen chamber without fear of rupture. In order to place the thin window in place, cap 28 is rotated in a direction indicated by arrows C in FIG. 5. In this orientation, X-ray radiation traveling a path indicated by arrow D in FIG. 5, will pass through aperture 88 in the top of the insert and through the thin film window 80 towards detector 50.

When the measurement of the sample is complete, cap 28 is rotated back to its initial position, illustrated in FIG. 4, prior to the repressurization of the specimen chamber. By this arrangement, the beryllium window is reoriented back into alignment with the channel such that the pressure differential, which is created when the vacuum in the chamber is released, will not damage or rupture thin film window 80.

In addition to the new and improved mechanism 10 for housing the radiation transmitting windows, the subject invention further includes a new and improved means for rotating cap 28. The rotation means includes, a spur gear 36, having radially projecting teeth. Spur gear 36 is fixedly mounted to one of the pins 68 of cap 28. An outer driving tube 32 is mounted coaxially around tubular probe 20. Outer tube 32 is provided with a set of axially projecting teeth 34 disposed to be in engagement with the spur gear 36. The rotation of the outer tube 32 relative to the inner tube drives spur gear 36 which rotates cap 28.

Figure 7:
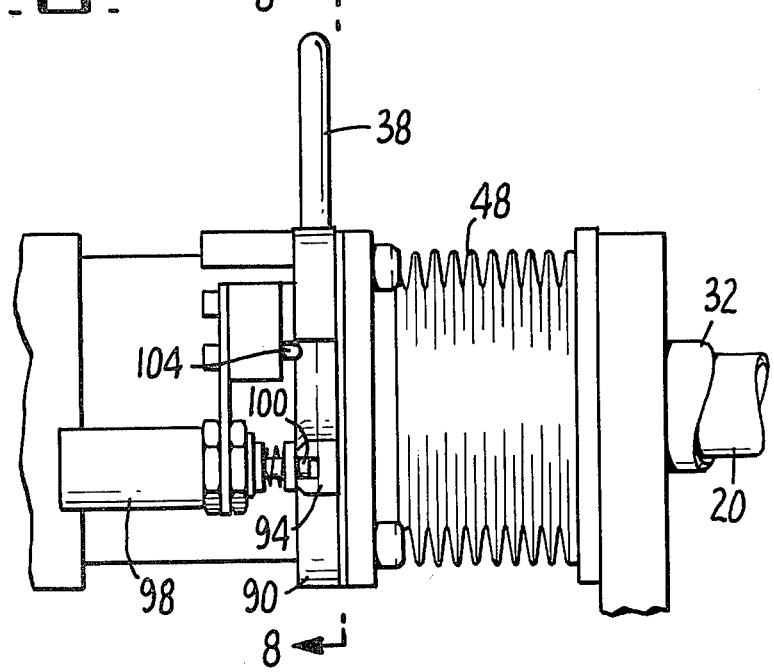
FIG. 7 is a side elevational view, with parts removed, illustrating the means for rotating the cap of the subject invention.
Figure 8:
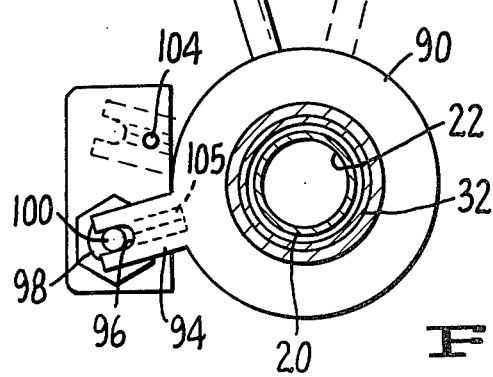
FIG. 8 is a cross sectional view, taken along the line 8—8 in FIG. 7, illustrating the locking mechanism of the subject invention.

Since the portion of probe 20, located forward of mounting flange 44, is disposed within the evacuated specimen chamber of the electron microscope, the actuation means for rotating the cap must be located to the rear of the flange. Referring more particularly to FIGS. 1, 7 and 8, it will be seen that the actuation means includes an annular ring 90 fixedly mounted around outer tube 32. A radially projecting lever member 38 is provided to facilitate the rotation of the outer tube.

In accordance with the subject invention, a locking means is provided to prevent the operator from inadvertently moving the thin film window into alignment with the channel prior to the establishment of a vacuum in the specimen chamber of the microscope. More particularly, a locking arm 94 is provided which is formed integrally with, and projects radially outwardly from annular ring 90. The free end of 94 is provided with a slot 96. The locking means further includes a solenoid 98 having a reciprocating plunger 100. Solenoid 98 is mounted in a manner such that plunger 100 is aligned with slot 96 of locking arm 94 when the cap 28 is in the first position. As long as plunger 100 is engaged with locking arm 94, the operator will be unable to rotate the outer tube 32 in an effort to move the cap into the second position, where the film thin window 80 would be subject to rupture.

The operation of solenoid 98 is controlled by a switch (not shown). The switch, which is normally disabled, is connected to a pressure detector 102. Pressure detector 102 is utilized to sense the pressure level in the specimen chamber. When the detector indicates that a vacuum has been established, an electrical signal is sent to enable the switch controlling solenoid 98. Thus, only after a vacuum has been established in the test chamber may the operator actuate the switch causing the plunger 100 in the solenoid to retract. Once the locking means has been disengaged, the outer tube 32 may be rotated, utilizing lever 38, to bring the thin film window into alignment with channel 22.

In order to facilitate accurate alignment of the thin film window, a spring-biased button 104 is provided. More particularly, and as illustrated in FIG. 8, the spring-biased button 104 is intended to engage with a V-shaped detent 105, located radially inwardly from slot 96 on locking arm 94. When outer tube 32 is rotated to the second position, the engagement of the spring-biased button 104 with detent 105 will supply a positive locking sensation to the mechanism to alert the operator of proper alignment.

As discussed above, the depth which the probe is introduced into the specimen chamber may be adjusted. Referring to FIG. 1, it will be seen that tube 32 projects through an aperture 106 in flange 44. The diameter of outer tube 32 is smaller than the diameter of aperture 106 such that a nonsealing mount is achieved. A metal accordian-type bellows 48 is affixed to the rear of flange 44 in a manner to form an air-tight construction. By this arrangement, the probe may be moved in an axial direction, in order to bring the end thereof into close proximity with the sample, for maximizing sensitivity.

In summary, there has been disclosed a new and improved mechanism for selectively aligning a radiation passing window with the channel of a detector. More particularly, a tubular probe 20 is provided having a channel 22 therein. A cap 28 is rotatably mounted to the free end of the tubular probe 20. Cap 28, having a diameter less than the probe, is rotatable between first and second positions. In the preferred embodiment, a pair of radiation passing windows 74 and 80 are mounted in the cap in a manner such that one window will be aligned with the channel 22 of the tube when the cap is oriented in the first position, while the remaining window will be aligned with the channel when the cap is rotated to the second position.

The subject invention further includes a means for rotating the cap 28 which is spaced from the end of the probe. An outer tube 32 is mounted about the probe and includes axially projecting teeth which engage with the spur gear 36 connected to the cap. The rotation of the outer tube 32 relative to probe 20 drives spur gear 36 for rotating cap 28. A lever 38 is mounted to the outer tube 32 to facilitate its rotation. In a preferred embodiment, a locking mechanism is provided to prevent the operator from rotating the thin film window into alignment with the channel until a vacuum is established in the test chamber.

While the subject invention has been described with reference to a preferred embodiment, it is to be understood that various other changes and modifications could be made therein, by one skilled in the art, without varying from the scope and spirit of the subject invention as defined by the appended claims.

We claim:

1. In a measurement device which includes an evacuated tubular radiation probe having an open end and an elongated channel formed therein extending from said open end, and with said probe further including a sensing means mounted in said channel, such that radiation entering said open end of said probe will travel along said channel to said sensing means and with said probe being provided with a mechanism for selectively aligning at least a first window with the open end of said channel, said mechanism comprising:

a cap means rotatably mounted at said open end of said probe, with the axis of rotation of said cap means being perpendicular to the longitudinal axis of said probe, said cap means being rotatable between a first position and a second position, and with the adjacent surfaces of said cap means and said probe being provided with a complementary spherical configurations and with a means being provided to effect a seal between said adjacent surfaces, and wherein said first window is mounted on said cap means in a manner such that said first window is aligned with said channel of said probe when said cap means is oriented in said first position and with said first window being moved out of alignment when said cap means is oriented in said second position, whereby the rotation of said cap means permits the selective alignment of said first window with said channel.

2. A mechanism as recited in claim 1 wherein said cap means further includes a second window mounted therein in a manner to be aligned with said channel in said probe when said cap means is oriented in said second position.

3. A mechanism as recited in claim 2 wherein said first window is significantly thinner than said second window whereby said first window is capable of passing radiation of lower energy levels, while said second window is thick enough to withstand an atmospheric pressure differential.

4. A mechanism as recited in claim 3 wherein said first window is formed from a thin foil having a thickness of 0.2 microns.

5. A mechanism as recited in claims 3 or 4 wherein said first window is on the order of 50 times thinner than said second window.

6. A mechanism as recited in claim 4 wherein said second window is formed from beryllium having a thickness in range of 8.5 to 12.7 microns.

7. A mechanism as recited in claim 1 wherein said open end of said probe includes a pair of opposed, axially projecting brackets, and with said cap means being pivotally mounted between said brackets such that the axis of rotation of said cap means extends between said brackets.

8. A mechanism as recited in claim 1 further including a means for rotating said cap means from said first position to a second position.

9. A mechanism as recited in claim 3 wherein said rotation means includes a spur gear mounted on said cap means, said rotation means further including an outer tubular member disposed coaxially around said probe, and with the end of said outer tubular member adjacent said cap means including a row of axially projecting teeth disposed to be engaged with said spur gear whereby the rotation of said outer tubular member relative to said probe drives said spur gear causing said cap means to rotate.

10. A mechanism as recited in claim 1 further comprising a means for replaceably mounting said first window in said cap means.

11. A mechanism as recited in claim 10 wherein said means for replaceably mounting said first window includes a hollow, cylindrical insert slidably mounted in a recess formed in said cap means, with said cylindrical insert having said first window mounted therein in a manner to be aligned with said channel when said cap means is oriented in said first position.

12. A mechanism as recited in claim 11 wherein said cap means further includes a second window mounted therein in a manner to be aligned with said channel in said probe when said cap means is oriented in said second position and wherein said insert further includes a pair of aligned apertures such that when said cap means is oriented in said second position, radiation can pass through said apertures in said insert to said second window in said cap means.

13. A mechanism as recited in claim 12 wherein the diameter of said cap means is less than the diameter of said tubular probe.

14. In a measurement device which includes an evacuated tubular radiation probe having an open end and an elongated channel formed therein extending from said open end, and with said probe further including a sensing means mounted in said channel, such that radiation entering said open end of said probe will travel along said channel to said sensing means, and with said probe being provided with a mechanism for selectively aligning at least a first window with the open end of said channel, and with said mechanism being actuated from a point spaced from said open end of said probe, said mechanism comprising:

a cap means rotatably mounted at said open end of said probe, with the axis of rotation of said cap means being perpendicular to the longitudinal axis of said probe, said cap means being rotatable between a first position and a second position, and with the adjacent surfaces of said cap means and said probe being provided with complementary spherical configurations and with a means being provided to effect a seal between said adjacent surfaces, and wherein said first window is mounted on said cap means in a manner such that said first window is aligned with said channel of said probe when said cap means is oriented in said first position and with said first window being moved out of alignment when said cap means is oriented in said second position; and means for rotating said cap means, said rotation means including a spur gear mounted on said cap means and with said rotation means further including an outer tubular member disposed coaxially around said probe, and with the end of said outer tubular member, adjacent said cap means, including a row of axially projecting teeth disposed to be engaged with said spur gear whereby the rotation of said outer tubular member relative to said probe drives said spur gear causing said cap means to rotate permitting the selective alignment of said first window with said channel.

15. A mechanism as recited in claim 14 wherein said cap means further includes a second window mounted therein in a manner to be aligned with said channel of said probe when said cap means is oriented in said second position.

16. A mechanism as recited in claim 15 wherein said first window is significantly thinner than said second window whereby said first window is capable of passing radiation having lower energy levels, while said second window is thick enough to withstand an atmospheric pressure differential.

17. A mechanism as recited in claim 16 wherein said first window is formed from a thin foil having a thickness of 0.2 microns and wherein said second window is formed from beryllium having a thickness in the range of 8.5 to 12.7 microns.

18. A mechanism as recited in claim 9 or 14 further including a lever means mounted to said outer tubular member at a point spaced from said cap means such that the rotational movement of said lever member imparts a rotational movement to said outer tubular member for rotating said cap means.

19. A mechanism as recited in claim 18 wherein said lever means is defined by an annular ring mounted around said outer tubular member, with said lever means further including a lever member projecting radially outwardly from said annular ring.

20. A mechanism as recited in claim 19 further including a means for positively locking said cap means in one position.

21. A mechanism as recited in claim 20 wherein said locking means includes a locking arm formed integrally with and projecting radially outwardly from said annular ring of said lever means, said locking means further including a solenoid means having a reciprocating plunger, said plunger being aligned with said locking arm and engageable therewith when said cap means is in one of said two positions.

22. A mechanism as recited in claim 14 further including a means for replaceably mounting said first window, said means including a hollow, cylindrical insert slidably mounted in a recess formed in said cap means, with said cylindrical insert having said first window mounted therein in a manner to be aligned with said channel when said cap means is oriented in said first position.

23. A mechanism as recited in claim 22 wherein said cap means further includes a second window mounted therein in a manner to be aligned with said channel of said probe when said cap means is oriented in said second position and wherein said insert further includes a pair of aligned apertures disposed such that when said cap means is oriented in said second position, radiation can pass through said apertures in said insert to said second window in said cap means.

24. A mechanism as recited in claim 14 wherein the diameter of said cap means is less than the diameter of said tubular probe.

25. In a measurement device of the type having a radiation sensor and a hollow, evacuated probe which is open at one end, and in which the sensor is mounted, an improved window support for the open end of the probe, said window support comprising:

a generally spherically shaped member;
means for mounting said spherical member for rotation about an axis in the open end of the probe;
means for effecting a seal between the open end of the probe and the outer surface of the spherical member;
means for remotely rotating the spherical member about said axis between a first position and a second position from a point which is displaced from the open end of the probe, and where said sperical member carries a first window, which is placed in line with the open end of the probe only when the spherical member is oriented in its first position.

26. A support as recited in claim 25 wherein said spherical member further includes a second window mounted therein in a manner to be aligned with the open end of said probe when the spherical member is oriented in the second position.

27. A support as recited in claim 25 wherein the first window is a radiation transparent thin foil.

28. A support as recited in claim 25 wherein the second window is thick enough to withstand an atmospheric pressure differential.

29. A support as recited in claim 25 wherein the diameter of the spherical member is less than the diameter of the probe.

30. A support as recited in claim 25 wherein the spherical member includes a series of gear teeth mounted thereon and the means for remotely rotating the spherical member includes a sleeve coaxially mounted with respect to the probe, the sleeve having a series of gear teeth at one end which engage the gear teeth on the spherical member, whereby rotation of the sleeve about its longitudinal axis rotates the spherical member.

* * * * *